United States Patent

Stauble et al.

[11] Patent Number: 6,048,212
[45] Date of Patent: Apr. 11, 2000

[54] RADIO FREQUENCY CONNECTOR

[75] Inventors: Eric Richard Stauble, West Newbury, Mass.; Konrad K. Benz, Miami, Fla.

[73] Assignee: Lucent Technologies, Inc., Murray Hill, N.J.

[21] Appl. No.: 09/044,658

[22] Filed: Mar. 19, 1998

[51] Int. Cl.7 ............................ H01R 12/00; H05K 1/00
[52] U.S. Cl. ................................................ 439/63; 493/65
[58] Field of Search ................................. 439/63, 64, 65

[56] References Cited

U.S. PATENT DOCUMENTS

| | | | |
|---|---|---|---|
| 3,591,834 | 7/1971 | Kolias | 317/701 |
| 3,828,304 | 8/1974 | Winn | 339/177 R |
| 4,636,015 | 1/1987 | Ford | 339/14 |
| 4,721,481 | 1/1988 | Grellmann et al. | 439/581 |
| 4,813,881 | 3/1989 | Kirby | 439/74 |
| 4,870,385 | 9/1989 | Jewell | 355/5 |
| 5,131,140 | 7/1992 | Zimmer | 29/846 |
| 5,186,655 | 2/1993 | Glenday et al. | 439/583 |
| 5,355,282 | 10/1994 | Yokemura et al. | 361/760 |
| 5,402,088 | 3/1995 | Pierro et al. | 333/33 |
| 5,439,386 | 8/1995 | Ellis et al. | 439/322 |
| 5,551,080 | 8/1996 | Chambers et al. | 455/348 |
| 5,618,205 | 4/1997 | Riddle et al. | 439/581 |

Primary Examiner—Steven L. Stephan
Assistant Examiner—Chandrika Prasad
Attorney, Agent, or Firm—Duane, Morris & Heckscher LLP

[57] ABSTRACT

An RF connector includes a finger which extends from a first member. The finger has an electrically conductive contact disposed on its surface. A second member has a recess formed in one if its edges. The recess is sized and positioned to receive the finger when the first and second members are mated. A flexible, electrically conductive contact is disposed on the second member in a position whereby at least a portion of the flexible contact extends in to the recess. When mated, the finger of the first member is disposed within the recess of the second member with the flexible contact engaging and making electrical contact with the contact on the finger.

10 Claims, 5 Drawing Sheets

RADIO FREQUENCY CONNECTOR

FIELD OF THE INVENTION

The present invention relates to electrical connectors and more particularly to radio frequency signal connectors.

BACKGROUND OF THE INVENTION

Radio frequency (RF) signal connectors are used to connect RF signal paths between RF components where those components are designed to be separable from one another. For example, from one RF signal conductor to another or from an RF conductor to an RF signal amplifier. Many times these RF signal connections must be made in limited access, confined spaces. Furthermore, it may be required that these connections be made without grasping or otherwise manipulating the connector itself.

Prior art RF connectors include the screw or bayonet type BNC connectors which require manual connection and disconnection as well as access to make or break these connections. Even the plug-in type RF connectors require some form of manipulation as well as manual access. Thus, these types of RF connectors are unsuitable for assemblies in which RF connections must be made in regions having limited access and where ease of disassembly and reassembly for maintenance, repair or upgrade purposes is desired.

SUMMARY OF THE INVENTION

An RF connector includes a finger portion extending from a first member, the finger portion having an electrically conductive contact disposed thereon. A second member has a recess formed therein adapted to receive the finger portion within the recess. A flexible, electrically conductive contact is disposed on the second member, with at least a portion thereof extending into the recess whereby, when the finger portion of the first member is placed within the recess of the second member, the flexible contact makes electrical contact with the electrically conductive contact disposed on the finger portion of the first member.

A BRIEF DESCRIPTION OF THE DRAWINGS

DETAILED DESCRIPTION OF THE INVENTION

Figure 1A:
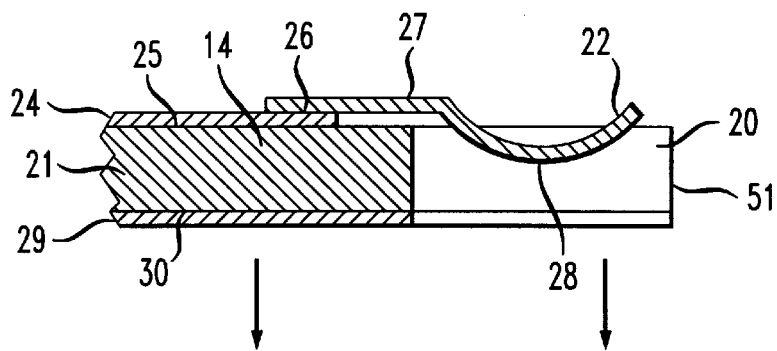
FIG. 1A is a cross-sectional view of a segment of a second member having a recess portion and a flexible contact portion of an RF connector in accordance with an embodiment of the present invention.
Figure 1B:
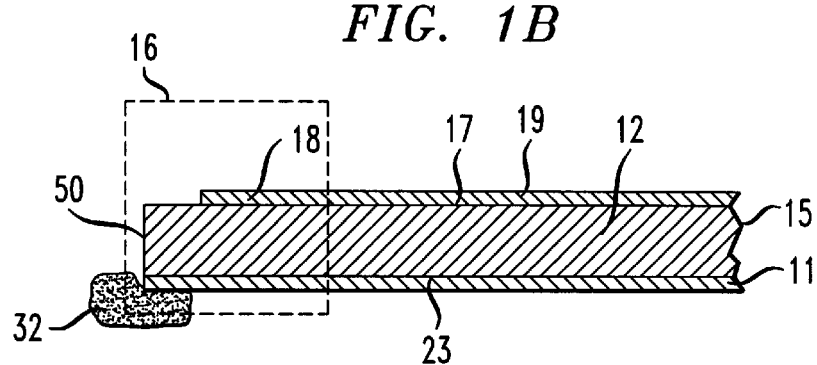
FIG. 1B is a cross-sectional view of a segment of a first member having a finger portion of an RF connector in accordance with an embodiment of the present invention.
Figure 1C:
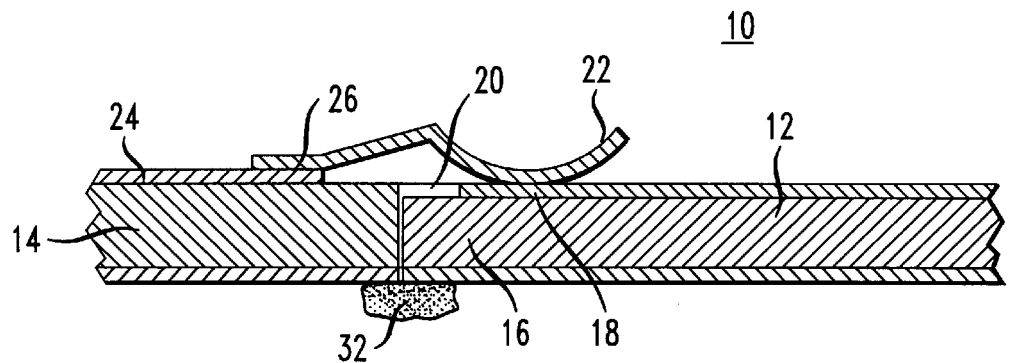
FIG. 1C is a cross-sectional view of the segments of the first and second members of the RF connector depicted in FIGS. 1B and 1A respectively in mated relationship in accordance with an embodiment of the present invention.

Referring to FIG. 1C, there is shown an embodiment of an RF connector in accordance with the present invention, generally referred to as 10. The connector 10 is depicted with a first member 12 in mated relationship with a second member 14. Referring also to FIG. 1B, the first member 12 comprises a first printed circuit board having a layer 15 of an electrically insulating material, such as FR4, PTFE or any other printed circuit board base material for example, having a finger portion 16 extending therefrom. The first member 12 includes a first edge 50 which is mated with a first edge 51 of the second member. The finger portion 16 has an electrical contact 18 disposed on a surface 17 of the electrically insulating layer 15. The contact 18 is electrically connected to a conductor 19 of an RF transmission path. The contact 18 and the conductor 19 are preferably formed by patterning a conductive layer (not shown) disposed on the surface 17, preferably comprising a gold or tin plated copper material, using printed circuit techniques known in the art. A second conductive layer 11, preferably comprising a gold or tin plated copper material, is disposed on another surface 23 of the electrically insulating layer 15. The conductive layer 11 forms a ground plane portion of the RF transmission paths associated with the conductors, such as conductor 19, patterned in the layer of electrically conductive layer disposed on the surface 17.

Referring also to FIG. 1A, the second member 14 comprises a second printed circuit board having a layer 21 of an electrically insulating material, such as FR4, PTFE or any other printed circuit board base material for example, having a recess 20 disposed therein. The second member 14 includes a first edge 51 which is mated with the first edge 50 of the first member 12 as explained above. A conductor 24 of an RF transmission path is disposed on a surface 25 of the electrically insulating member 21. The conductor 24 is preferably formed by patterning a conductive layer (not shown), preferably comprising a gold or tin plated copper material, using printed circuit techniques known in the art. A second conductive layer 29, preferably comprising a gold or tin plated copper material, is disposed on another surface 30 of the electrically insulating layer 21. The conductive layer 29 forms a ground plane portion of the RF transmission paths associated with the conductors, such as conductor 24, patterned in the layer of electrically conductive layer disposed on the surface 25.

A flexible, electrically conductive contact 22 is attached to a terminus 26 of the conductor 24 by soldering or other attachment techniques known in the art. The contact 22 comprises a flexible arm region 27 and and a contact engaging region 28. In the embodiment depicted in FIGS. 1A and 1C, the flexible contact 22 end of the flexible arm region 27 is attached to the terminus 26 of the conductor 24 which enables the contact region 28 to flex from its non-engaging position shown in FIG. 1A to its engaging position when the first 12 and second 14 members are mated as shown in FIG. 1C.

As shown in FIG. 1C, the first member 12 and the second member 14 are mated by engaging the two members such that the finger portion 16 of the first member 12 is within the recess 20 of the second member 14, and the conductive layers 11 and 29 are in electrical contact with an electrically conductive ground strap 32. When so mated, the contact engaging region 28 of the flexible contact 22 engages and makes electrical contact with the electrical contact 18 on the finger portion 16 of the first member 12 and remains so engaged under tension caused by the flexing of the flexible region 27 of contact 22 as long as the members 12 and 14 remain mated. In addition, the ground planes formed by the electrically conductive layers 11 and 29 are electrically connected through the conductive ground strap 32. Thus, the RF transmission path formed by the conductor 19 and ground plane 11 is connected to the RF transmission path formed by conductor 24 and ground plane 29 through the flexible contact 22 and the ground strap 32. Separating the first 12 and second 14 members causes the disengagement of the of the contact engaging portion 28 of the flexible contact 22 from the electrical contact 18 and the ground plane 29 from the ground strap 32 thereby breaking the RF connection between the first member 12 and the second member 14.

Figure 2:
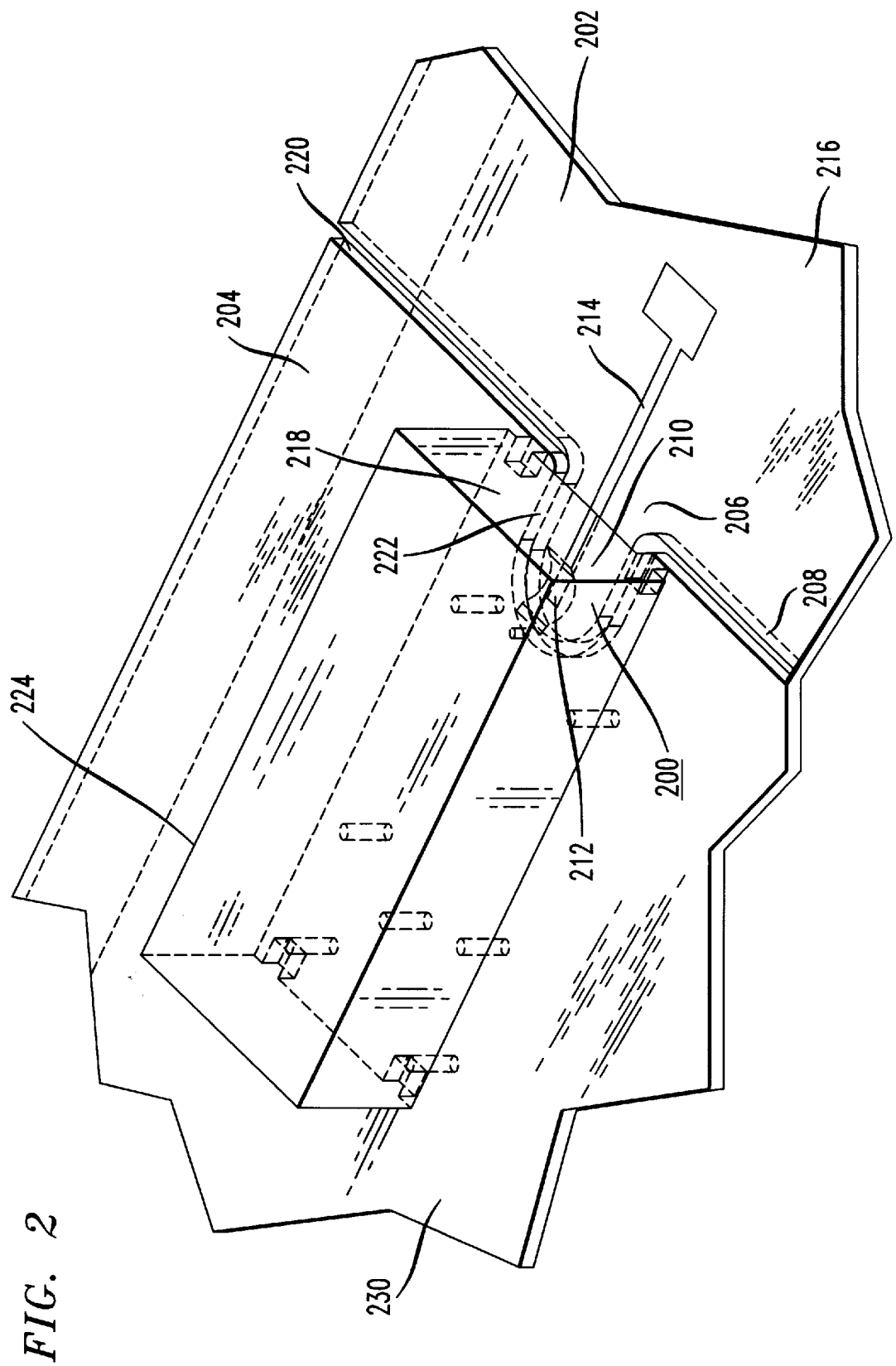
FIG. 2 is an isometric view, partially in phantom, of another embodiment of an RF connector of the present invention.

Referring now to FIG. 2, there is shown another embodiment of the RF connector of the present invention. In the embodiment depicted, the RF connector, generally designated 200, effects an RF connection between an RF port board 202 and an RF amplifier board 204 when the two are mated. In this embodiment, the RF port board 202 and the RF amplifier board 204 are separable. Accordingly, the RF connection which is made when the boards 202 and 204 are mated, is broken when the boards are separated. A first member 206 of the RF connector 200 comprises at least a segment of an edge 208 of the RF port board 202 having a finger portion 210 extending outwardly therefrom. The material of the RF port board 202 comprises an electrically insulating material such as FR4, PTFE or any other printed circuit board base material, for example. The finger portion 210 has an electrical contact 212 disposed thereon. The contact 212 is, in the embodiment depicted, a terminal region of a conductor 214 of an RF transmission path disposed on the upper surface 216 of the RF port board 202. The contact 212 and the conductor 214 are preferably formed by patterning a conductive layer (not shown) disposed on the surface 216, preferably comprising a gold or tin plated copper material, using printed circuit techniques known in the art. A second conductive layer 302 (see FIG. 3), preferably comprising a gold or tin plated copper material, is disposed on the lower surface 304 (see FIG. 3) of the RF port board 202. The second conductive layer forms a ground plane portion of the RF transmission paths associated with the conductors, such as conductor 214, patterned in the layer of electrically conductive material disposed on the upper surface 216 of the RF port board 202.

A second member 218 of the RF connector 200 comprises at least a segment of an edge 220 of the RF amplifier board 204 having a recess 222 disposed therein. The material of the RF amplifier board 204 comprises an electrically insulating material such as FR4, teflon or any other printed circuit board base material, for example. In the embodiment depicted in FIG. 2, an RF component, such as a diplex filter 224, for example, is mounted on the RF amplifier board 204. The filter 224 and other RF components mounted on the RF amplifier board 204 are interconnected by RF transmission paths comprising conductors, such as conductor 306 (see FIG. 3) and conductor 406 (see FIG. 4) which are formed by patterning a conductive layer (not shown) 4disposed on the upper surface 230 of the RF amplifier board 204. A second conductive layer 308 (see FIG. 3), preferably comprising a gold or tin plated copper material, is disposed on the lower surface 310 (see FIG. 3) of the RF amplifier board 204. The second conductive layer 308 forms a ground plane portion of the RF transmission paths associated with the conductors such as conductors 306 and 406 patterned in the layer of electrically conductive material disposed on the upper surface 216 of the RF port board 202. When the RF port board 202 and the RF amplifier board 204 are mated, electrical contact is made between the ground planes of both boards, preferably through electrically conductive ground straps, for example ground strap 312 (see FIGS. 3 and 4), as will be subsequently described in more detail.

Figure 3:
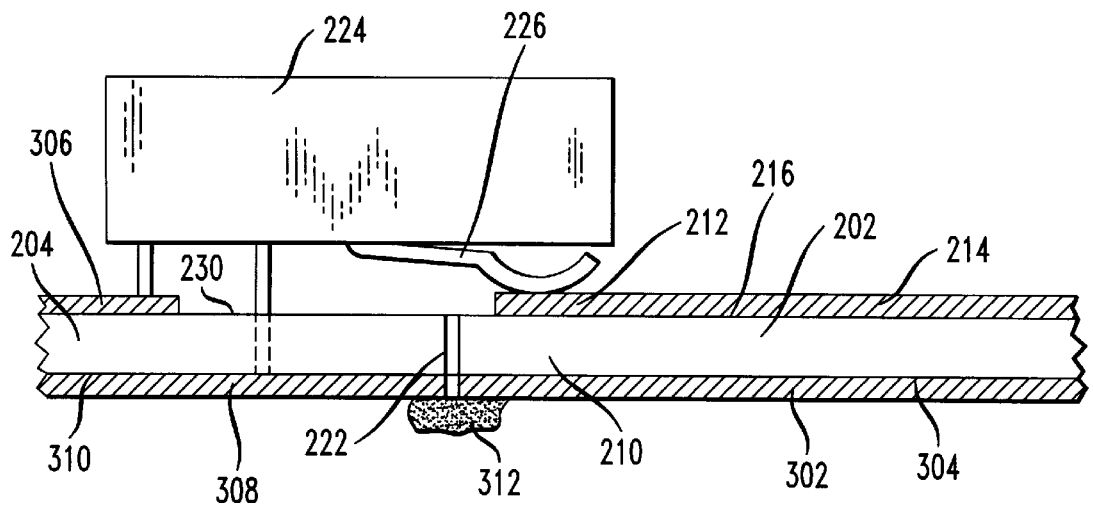
FIG. 3 is a side elevation view of the embodiment of yet another embodiment of an RF connector of the present invention.
Figure 4:
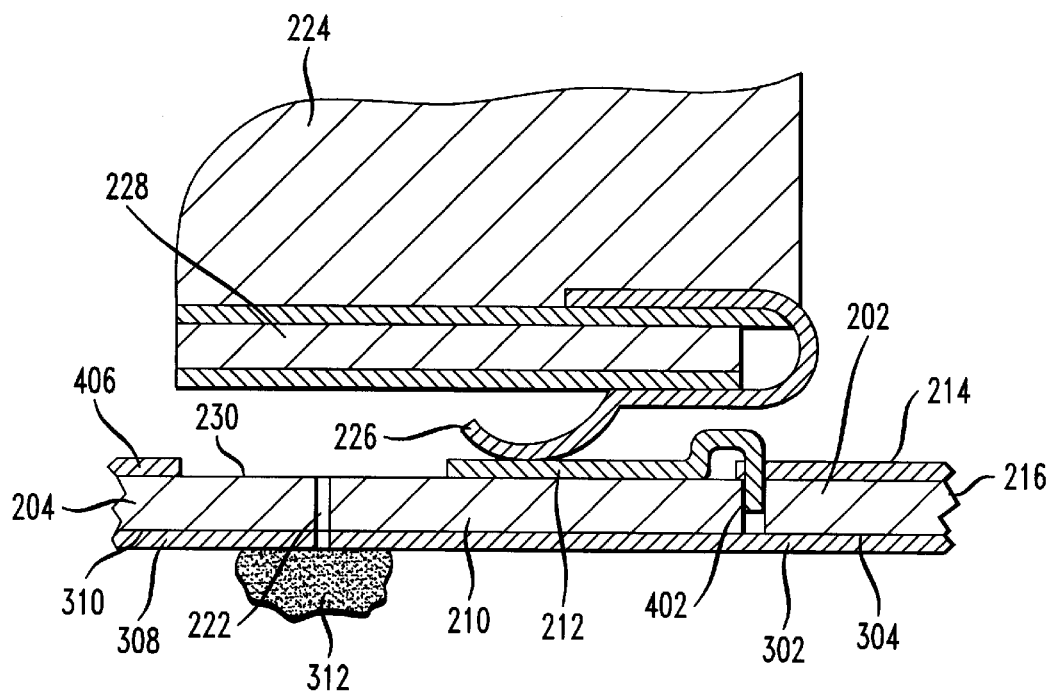
FIG. 4 is a partial, cross-sectional view of the embodiment of the RF connector depicted in FIG. 2.

As also shown in FIGS. 3 and 4, a flexible, electrically conductive contact 226 is mounted on the filter 224. The flexible contact 226 preferably comprises a gold plated copper material. A terminal end of the contact 226 is electrically connected to a terminal (not shown) of the filter 224 by, for example, a conductor (not shown) on a printed circuit board 228 (see FIG. 4) on which the filter components are mounted. In FIG. 3, the terminal end of the flexible contact 226 is anchored to a through hole (not shown) of the printed circuit board of the filter 224 displaced inwardly from the edge. In FIG. 4, the terminal end of the flexible contact 226 is attached to a terminal on the upper surface of the printed circuit board 228 of the filter 224 in proximity to the edge, extending around the edge and under the printed circuit board 228 as shown. The filter 224 is positioned on the RF amplifier board 204 such that the flexible contact 226 at least partially extends into the recess 222. Electrical contact 212, preferably comprising a gold plated copper material, is mounted on the upper surface of the finger portion 210 and is anchored to a through hole 402 in the RF port board 202, making electrical contact with conductor 214. Consequently, when the RF port board 202 and the RF amplifier board 204 are mated, the flexible contact 226 comes into contact with the electrical contact 212 on the finger portion 210 of the RF port board 202. Also, as previously described, the ground planes of both boards are electrically interconnected, through ground strap 312 for example. As a result, in the embodiment depicted in FIGS. 2, 3 and 4, an RF signal path is created between the RF transmission path 214 on the RF port board 202 and the filter 224 mounted on the RF amplifier board 204.

Figure 5:
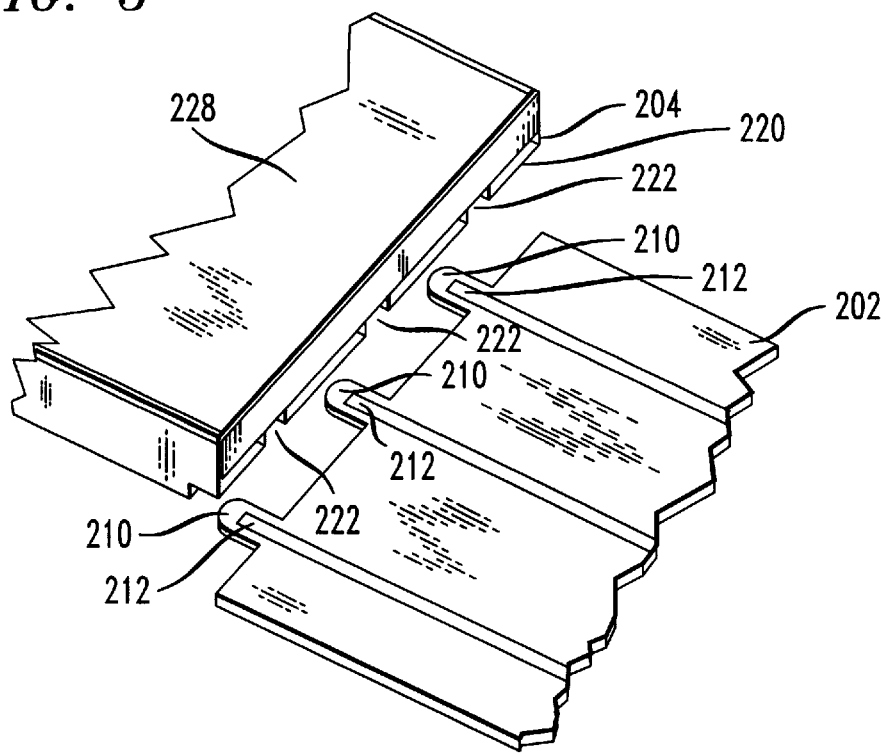
FIG. 5 is a partial, isometric view of pre-mated RF amplifier board and RF port board assemblies.

Referring to FIG. 5, there is shown an apparatus employing at least three RF connectors in accordance with the present invention. In this apparatus, the RF port board 202 includes three finger portions 210, each having an electrical contact 212 disposed thereon. Each electrical contact 212 is electrically connected to a respective RF transmission path formed by conductors 214 in conjunction with the ground plane (not shown) as previously described. The RF amplifier board 204 is encased in an RF amplifier board housing 228 which both protects and shields the RF amplifier board and the components mounted thereon including filters 224. The housing is preferably made of an electrically conductive plastic or metallic material. The edge 220 of the RF amplifier board 204 has three recesses 222 which are dimensioned and positioned along the edge 220 to receive the finger portions 210 when the RF amplifier board 204 and the RF port board 202 are mated.

In one example of the use of the RF connectors of the present invention, an RF amplifier board is removeably mounted between two RF port boards in an aluminum clam shell housing. In this example, there are five diplexer filters mounted on the RF amplifier board, two along one edge of the RF amplifier board and three along the opposite edge of the RF amplifier board as shown, for example, in FIG. 5. Each filter has a flexible contact which at least partially extends into a respective recess in an edge of the RE amplifier board as previously described.

The component is assembled by removeably mounting the two RF port boards in the aluminum clamshell housing. The housing has five RF connectors mounted therethrough, three on one side and two on the opposite side. The center contact of each RF connector is electrically connected to a respective RF transmission path on a respective one of the RF port boards, with the outer, or shield, contact making electrical contact with the aluminum clamshell housing. It is preferred that at least a portion of the ground plane on the bottom surface of each of the RF port boards and the RF amplifier board make electrical contact with the aluminum clam shell housing when the boards are installed therein so that the ground planes and the housing are at the same electrical potential, hereinafter referred to as case ground.

Figure 6:
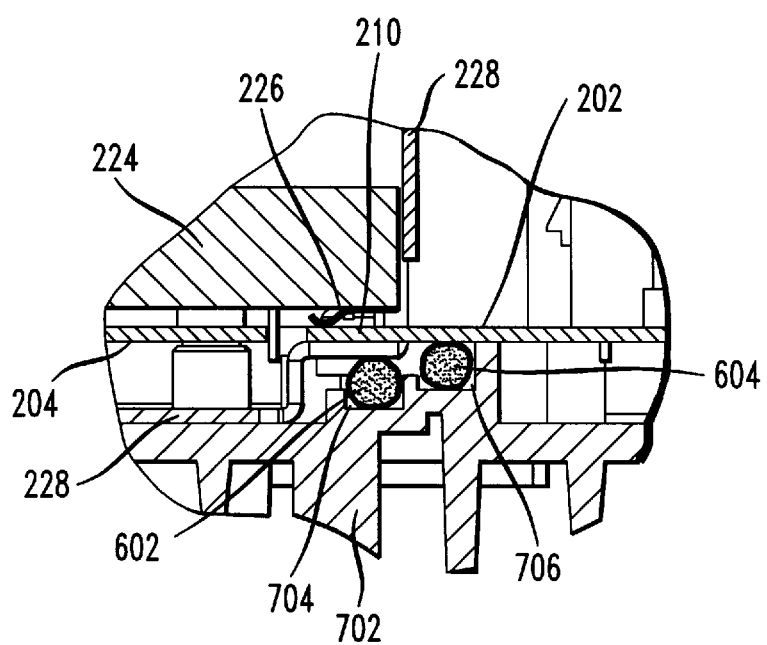
FIG. 6 is a sectional view of RF amplifier board and RF port board ground connections.
Figure 7:
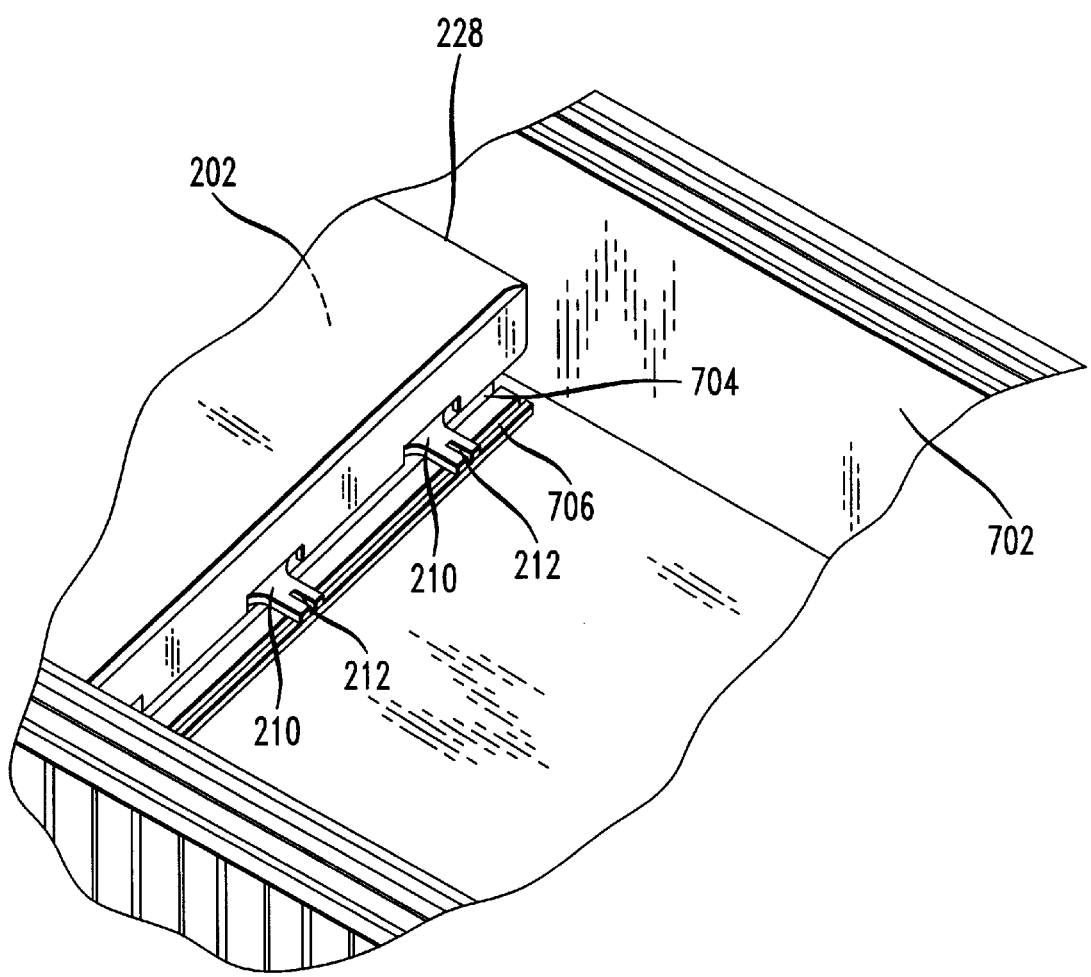
FIG. 7 is a partial isometric view of an RF port board assembly installed in a housing.

The ground plane on the bottom surface of each of the RE port boards and the RF amplifier board are electrically interconnected using ground straps. For example, referring to FIG. 7, an RF port board 202 is shown mounted within a cast aluminum clamshell housing 702. Trenches 704 and 706 are formed in the bottom of the housing 702 for receiving ground straps 602 and 604 as shown in FIG. 6. In the embodiment depicted in FIGS. 6 and 7, the RF amplifier board 204 is mounted within electrically conductive housing 228. The ground plane (not shown) of the RF amplifier board 204 is electrically connected to the conductive RF amplifier board housing 228. When mounted within the clamshell housing 702, the ground plane (not shown) on the bottom surface of the RF port board engages and makes electrical contact with the electrically conductive ground strap 604 disposed in the trench 706 formed in the bottom of the electrically conductive clamshell housing 702.

When the RF amplifier board is removeably mounted within the aluminum clamshell housing, the finger portions 210 on the RF port boards and the electrical contacts disposed thereon are engaged in mating relationship with the recesses in the side edges of the RF amplifier board and the flexible contacts 226 attached to the diplex filters 224. In addition, at least a portion of the bottom wall of the electrically conductive RF amplifier board housing 228 engages and makes electrical contact with the electrically conductive ground strap 602 disposed in the trench 704 formed in the bottom of the electrically conductive clamshell housing 702. Since the ground plane (not shown) disposed on the bottom surface of the RF amplifier board 204 is electrically connected to the conductive RF amplifier board housing 228, the ground plane of the RF amplifier board is electrically connected to the ground planes of the RF port boards, when installed in the conductive clamshell housing. Thus, RF transmission paths between the RF connectors connected through the walls of the clamshell housing and the filters are formed through the RF transmission paths on the RF port boards 202, the contacts 212 on the finger portions 210 and the flexible contacts 226 when the RF amplifier board 204 is installed in the clamshell housing 702 and mates with the RF port boards 202. To maintain or replace the RF amplifier board, the clamshell housing is opened and the RF amplifier board is demounted and lifted from the box. To replace. the RF amplifier board is simply remounted in the box which causes the RF connections between the diplexers and the RF connectors to be made as previously described.

It should be understood that various changes in the details, materials and arrangements of the parts which have been described and illustrated in order to explain the nature of this invention may be made by those skilled in the art without departing from the principle and scope of the invention as described in the following claims.

We claim:

1. A radio frequency (RF) signal connector comprising:
   (a) a first member having a finger portion at a first edge thereof, said first member comprising an electrically insulating layer with a ground plane comprising a layer of an electrically conductive material disposed on at least a portion of a first surface of said insulating layer of said first member;
   (b) an electrically conductive contact disposed on at least a portion of a surface of said finger portion opposite said first surface of said insulating layer;
   (c) a second member having a recess formed in a first edge thereof adapted to receive said finger portion therein, said second member comprising an electrically insulating layer having a ground plane comprising a layer of an electrically conductive material disposed on at least a portion of a first surface of said insulating layer of said second member;
   (d) a flexible, electrically conductive contact disposed on said second member, with at least a portion thereof positioned over and at least partially extending into said recess, whereby, when the first and second members are mated, said finger portion is disposed within said recess and the flexible contact makes electrical contact with the contact disposed on said finger portion; and
   (e) means for electrically connecting the ground plane of the first member to the ground plane of the second member when the first and second members are mated.

2. The RF connector in accordance with claim 1 wherein said means for electrically connecting the ground planes of said first and second members comprises at least one electrically conductive ground strap in electrical contact with said ground planes.

3. The RF connector in accordance with claim 1 wherein:
   (a) said first member comprises a first printed circuit board and said electrically conductive contact disposed on said finger portion is the terminal region of an RF transmission path on said first printed circuit board; and
   (b) said second member comprises a second printed circuit board and said flexible contact is electrically connected to an RF component mounted on said second printed circuit board.

4. The RF connector in accordance with claim 3 wherein said RF component is an RF filter.

5. The RF connector in accordance with claim 3 wherein said first and second printed circuit boards are removeably mounted within a housing in mating relationship whereby the finger portion is disposed within said recess, with the flexible contact engaged in electrical contact with the electrically conductive contact disposed on the finger portion.

6. The RF connector in accordance with claim 5 wherein said housing comprises an electrically conductive material and the means for electrically connecting the ground planes of said first and second printed circuit boards comprises at least one electrically conductive ground strap disposed in at least one trench formed in the housing.

7. The RF connector in accordance with claim 6 wherein the means for electrically connecting the ground planes of said first and second printed circuit boards comprises a first ground strap disposed in a first trench extending along, and in proximity to the first edge of said first printed circuit board, and a second ground strap disposed in a second trench extending along and in proximity to the first edge of said second printed circuit board.

8. The RF connector in accordance with claim 7 wherein the first printed circuit board comprises an RF port board and said second printed circuit comprises an RF amplifier board.

9. The RF connector in accordance with claim 8 wherein said RF amplifier board is removeably mounted between, and in mating engagement with, two RF port boards within said housing.

10. The RF connector in accordance with claim 9 wherein said housing comprises an aluminum clamshell case.

* * * * *